(12) United States Patent
Yoshida et al.

(10) Patent No.: US 11,699,741 B2
(45) Date of Patent: Jul. 11, 2023

(54) METAL-CONTAINING LINER PROCESS

(71) Applicant: Tokyo Electron Limited, Tokyo (JP)

(72) Inventors: Yusuke Yoshida, Albany, NY (US);
Sergey Voronin, Albany, NY (US);
Christopher Talone, Albany, NY (US);
Alok Ranjan, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 44 days.

(21) Appl. No.: 17/336,043

(22) Filed: Jun. 1, 2021

(65) Prior Publication Data

US 2022/0384607 A1    Dec. 1, 2022

(51) Int. Cl.
| | | |
|---|---|---|
| *H01L 29/66* | (2006.01) | |
| *H01L 21/8234* | (2006.01) | |
| *H01L 29/78* | (2006.01) | |
| *H01L 29/06* | (2006.01) | |
| *H01L 21/311* | (2006.01) | |

(Continued)

(52) U.S. Cl.
CPC .. *H01L 29/6656* (2013.01); *H01L 21/823431* (2013.01); *H01L 21/823468* (2013.01); *H01L 29/6653* (2013.01); *H01L 29/66545* (2013.01); *H01L 29/66553* (2013.01); *H01L 29/66742* (2013.01); *H01L 29/785* (2013.01);
(Continued)

(58) Field of Classification Search
CPC ........ H01L 21/02178; H01L 21/02181; H01L 21/02183; H01L 21/02186; H01L 21/0228; H01L 21/28556; H01L 21/31122; H01L 21/32135; H01L 21/823431; H01L 21/823468; H01L 29/0653; H01L 29/6653; H01L 29/66545; H01L 29/66553; H01L 29/6656; H01L 29/66742; H01L 29/785; H01L 29/78696; B82Y 10/00; B82Y 40/00

See application file for complete search history.

(56) References Cited

U.S. PATENT DOCUMENTS

| | | | |
|---|---|---|---|
| 10,903,077 B2 | 1/2021 | Yoshida et al. | |
| 2018/0040713 A1* | 2/2018 | Chang | ............. H01L 21/823481 |

(Continued)

OTHER PUBLICATIONS

George, S., "Mechanisms of Thermal Atomic Layer Etching," Accounts of Chemical Research, vol. 53, Issue 6, Jun. 1, 2020, pp. 1151-1160.

(Continued)

*Primary Examiner* — Cheung Lee
(74) *Attorney, Agent, or Firm* — Slater Matsil, LLP

(57) ABSTRACT

In an example, a method includes depositing a first sidewall spacer layer over a substrate having a layer stack including alternating layers of a nanosheet and a sacrificial layer, and a dummy gate formed over the layer stack, the first sidewall spacer layer formed over the dummy gate. The method includes depositing a metal-containing liner over the first sidewall spacer layer; forming a first sidewall spacer along the dummy gate by anisotropically etching the metal-containing liner and the first sidewall spacer layer; performing an anisotropic etch back process to form a plurality of vertical recesses in the layer stack; laterally etching the layer stack and form a plurality of lateral recesses between adjacent nanosheets; depositing a second sidewall spacer layer to fill the plurality of lateral recesses; and etching a portion of the second sidewall spacer layer to expose tips of the nanosheet layers.

19 Claims, 9 Drawing Sheets

(51) Int. Cl.
    *H01L 21/3213*     (2006.01)
    *H01L 21/285*      (2006.01)
    *H01L 21/02*       (2006.01)
    *H01L 29/786*      (2006.01)

(52) U.S. Cl.
    CPC .... *H01L 21/0228* (2013.01); *H01L 21/02178* (2013.01); *H01L 21/02181* (2013.01); *H01L 21/02183* (2013.01); *H01L 21/02186* (2013.01); *H01L 21/28556* (2013.01); *H01L 21/31122* (2013.01); *H01L 21/32135* (2013.01); *H01L 29/0653* (2013.01); *H01L 29/78696* (2013.01)

(56) References Cited

U.S. PATENT DOCUMENTS

| 2019/0267463 | A1 | 8/2019 | Chao et al. | |
|---|---|---|---|---|
| 2021/0376093 | A1* | 12/2021 | Chu | H01L 29/0847 |
| 2022/0238660 | A1* | 7/2022 | Huang | H01L 29/401 |

OTHER PUBLICATIONS

Kukli, K. et al., "Atomic Layer Deposition of Hafnium Dioxide Films from Hafnium Tetrakis (ethylmethylamide) and Water," Chemical Vapor Deposition, vol. 8, Issue 5, Aug. 29, 2002, pp. 199-204.

Mackus, A., et al., "Synthesis of Doped, Ternary, and Quaternary Materials by Atomic Layer Deposition: A Review," Chemistry of Materials, vol. 31, Issue 4, Dec. 10, 2018, pp. 1142-1183.

\* cited by examiner

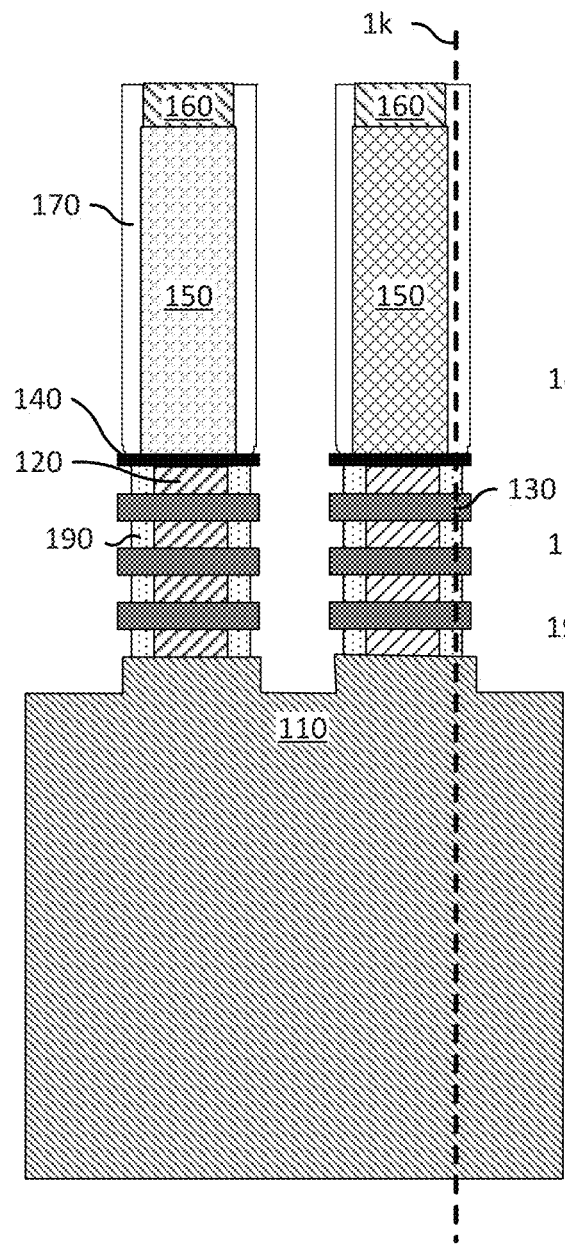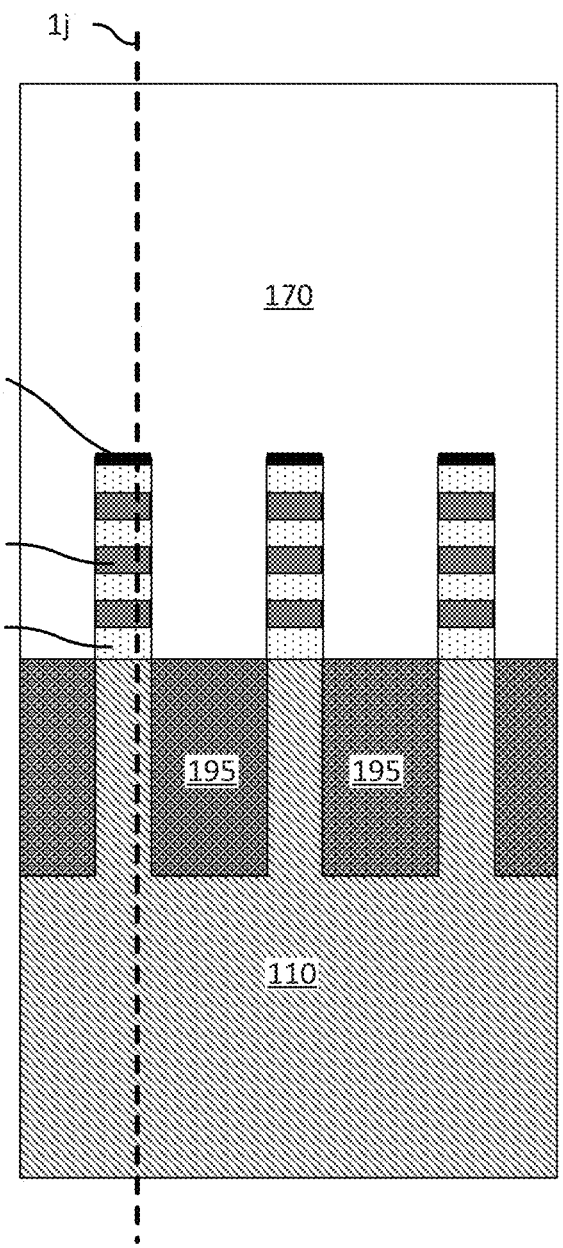
FIGURE 1J
FIGURE 1K

METAL-CONTAINING LINER PROCESS

TECHNICAL FIELD

The present invention relates generally to a method of transistor fabrication, and, in particular embodiments, to a metal-containing liner process.

BACKGROUND

The improvement of integrated circuit (IC) manufacturing has largely been driven by increasing device density to improve speed, performance, and manufacturing costs. With the scaling to smaller node sizes, IC device architectures have evolved from two-dimensional (2D) planar structures to three-dimensional (3D) vertical structures, such as fin field-effect transistors (FinFET). The further development of 3D device structures has led to the concept of gate-all around (GAA) devices comprising nanosheet or nanowire structures. A nanosheet or nanowire (nanosheet/nanowire) transistor may offer increased effective width and device performance, thereby expected as a promising candidate for the replacement of FinFET at the 5 nm node and beyond.

Some of the unique features in manufacturing nanosheet/nanowire transistors compared to FinFET are stacked sheets formation by epitaxy, inner spacer formation, a dummy gate formation followed by channel release, and multi-threshold voltage processing. Owing to these features, manufacturing processes for nanosheet/nanowire transistors tend to be more complicated and pose unique challenges in fabrication and material selection. Further development of manufacturing processes is therefore needed for the implementation of nanosheet/nanowire transistors.

SUMMARY

A method of processing a substrate includes depositing a first sidewall spacer layer over the substrate. The substrate includes a layer stack including alternating layers of a nanosheet and a sacrificial layer, and a dummy gate formed over the layer stack, the first sidewall spacer layer formed over the dummy gate. The method includes depositing a metal-containing liner over the first sidewall spacer layer; forming a first sidewall spacer along the dummy gate by anisotropically etching the metal-containing liner and the first sidewall spacer layer; after forming the first sidewall spacer, performing an anisotropic etch back process to form a plurality of vertical recesses in the layer stack; laterally etching the layer stack to selectively remove a part of the sacrificial layers and form a plurality of lateral recesses between adjacent nanosheets; depositing a second sidewall spacer layer to fill the plurality of lateral recesses; and etching a portion of the second sidewall spacer layer to expose tips of the nanosheet layers, the remaining portion of the second sidewall spacer layer forming a second sidewall spacer.

A method of processing a substrate includes performing a plurality of deposition-etch steps to form a first sidewall spacer. The plurality of deposition-etch steps includes depositing a first sidewall spacer layer over the substrate, where the substrate including a layer stack including alternating layers of a nanosheet and a sacrificial layer, and a dummy gate disposed over the layer stack. The method includes depositing a metal-containing liner over the first sidewall spacer layer; and anisotropically etching the metal-containing liner and the first sidewall spacer layer; performing an anisotropic source/drain fin etch back to form vertical recesses in the layer stack; isotropically etching the layer stack to selectively remove a part of the sacrificial layer and form indentations between adjacent ones of the nanosheets; depositing a second sidewall spacer layer to fill the indentations; and etching a portion of the second sidewall spacer layer to expose tips of the nanosheets, the remaining portion of the second sidewall spacer layer forming a second sidewall spacer.

A method of processing a substrate includes performing a first plurality of deposition-etch steps to form a first sidewall spacer, the first plurality of deposition-etch steps including: depositing a first sidewall spacer layer over the substrate, the substrate including a layer stack including alternating layers of a nanosheet layer and a sacrificial layer, and a dummy gate disposed over the layer stack; depositing a metal-containing liner over the first sidewall spacer layer; and anisotropically etching the metal-containing liner and the first sidewall spacer layer; performing an anisotropic source/drain fin etch back process to form vertical recesses; laterally etching to selectively remove a part of the sacrificial layer and form indentations between the nanosheets; performing a second plurality of deposition-etch steps to form a second sidewall spacer, the second plurality of deposition-etch steps including: depositing a second sidewall spacer layer to fill at least a portion of the indentations; and etching a portion of the second sidewall spacer layer to expose tips of the nanosheets.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1K illustrate cross sectional views of an example substrate during an example process of fabrication at various stages in accordance with various embodiments, wherein FIG. 1A illustrates the substrate comprising two dummy gate structures, a hard mask, and an underlying stack of nanosheets and sacrificial layers after a first spacer formation and a liner formation, FIG. 1B illustrates the substrate after a spacer and liner etch back and a source/drain fin etch back, FIG. 1C illustrates the substrate after a lateral recess etch, FIG. 1D illustrates the substrate after a second sidewall spacer formation, FIG. 1E illustrates the substrate after a second sidewall spacer etch back, FIG. 1F illustrates the substrate after a liner removal, FIG. 1G illustrates the substrate after source/drain formation, FIG. 1H illustrates the substrate, in another example, after source/drain formation without a liner removal, FIG. 1I illustrates the substrate, in another example, having no liner and after a second sidewall spacer etch back, FIG. 1J illustrates an extended cross-sectional view of FIG. 1F, and FIG. 1K illustrates another cross-sectional view perpendicular to FIG. 1J;

FIGS. 2A-2D illustrate cross sectional views of an example substrate during an example process of fabrication in accordance with alternate embodiments, wherein FIG. 2A illustrates the substrate comprising two dummy gate structures, a hard mask, and an underlying stack of nanosheets and sacrificial layers after a first spacer formation, FIG. 2B illustrates the substrate after a first spacer etch back, FIG. 2C illustrates the substrate after a liner formation, and FIG. 2D illustrates the substrate after a liner etch back and a source/drain fin etch back;

FIGS. 3A-3C illustrate process flow charts of methods of fabricating a nanosheet transistor on a substrate in accordance with various embodiments, wherein FIG. 3A illustrates an embodiment process flow, FIG. 3B illustrates an alternate embodiment process flow, and FIG. 3C illustrates another alternate embodiment process flow.

DETAILED DESCRIPTION OF ILLUSTRATIVE EMBODIMENTS

Figures 1A, 1B:
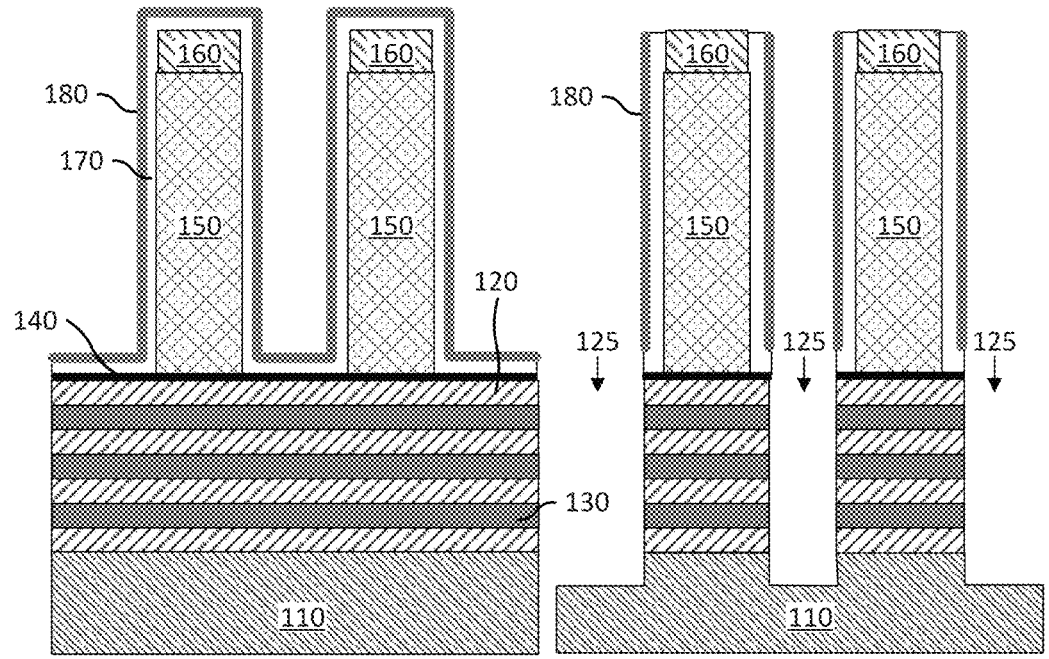

This application relates to fabrication of semiconductor devices, for example, integrated circuits comprising semiconductor devices, and more particularly to 3-D devices such as gate-all-around field effect transistors (GAA FETs). One of the challenges in the fabrication of such 3-D devices relates to the electrical isolation of the gate with other device regions such as source and drain regions. Sidewall spacers are typically used to separate gates with such regions. Embodiments of the present application disclosure methods of forming sidewalls spacers without compromising device characteristics as will be described in more detail.

Various embodiments of this disclosure describe improved methods of protecting a spacer by forming a metal-containing liner over the surface of the spacer. The embodiment methods use materials that contain metal elements such as metal oxides, metal nitrides, metal oxynitrides, and metal silicates, which may provide better etch resistivity. In various embodiments, the formation of a metal-containing liner is performed before the source/drain fin etch back so that the nanosheets and the lateral recess region are free from the metal-containing liner.

In a FET device, sidewall spacers are used to ensure separation between electrical contacts. In a typical nanosheet transistor architecture, two spacers may be used: an outer spacer, also known as gate spacer, to isolate a dummy gate structure and an inner spacer to isolate a source/drain structure in the lateral recess between the nanosheets.

For the selection of spacer material, there is a trade-off in terms of dielectric constant (k value). In general, a material with a high k value, as a spacer, may reduce gate leakage current, while a material with a low k value may be advantageous in reducing fringe capacitance and consequently parasitic capacitance in the device. Parasitic capacitance is projected to increase as the size of an IC device continues to shrink, and therefore the reduction of parasitic capacitance has been seen as one of the key challenges in the next-generation transistor design. As a result, there has been a growing interest in materials with a moderate k value such as silicon oxycarbonitride (SiOCN, k~4.5), silicon boron carbonitride (SiBCN, k~5), and silicon carbonitride (SiCN, k~5).

However, when implementing these spacers, the damage of the outer spacer during fabrication processes, in particular during an inner spacer etch back process, has been a significant challenge. This challenge is mainly due to the similar materials properties of the outer and inner spacer materials resulting in a damaged outer spacer. This damaged outer spacer tend to have uneven coverage over the surface of a dummy gate and may hinder device performance.

In various embodiments, a metal-containing liner is formed to protect an outer spacer. Compared to other commonly used materials such as silicon dioxide and the like, the metal-containing materials in accordance with embodiments may offer better etch resistivity, and thereby achieving the required protection with a reduced liner thickness. Moreover, in various embodiment methods, the deposition of the metal-containing liner is performed without contaminating a lateral recess, advantageously resulting in a better spacer quality that may improve device performance.

In the following, FIGS. 1A-1H illustrate steps of nanosheet device fabrication including liner formation in accordance with an embodiment. In FIGS. 2A-2D, steps of fabrication in accordance with alternate embodiments are introduced. Several embodiment process flows of device fabrication are then described referring to FIGS. 3A-3C. Lastly, an example processing tool for the embodiment methods is illustrated in FIG. 4.

FIG. 1A illustrates a cross-sectional view of a semiconductor device during fabrication. The semiconductor structure may have undergone a number of steps of processing following, for example, a conventional process. For example, the semiconductor structure may comprise a substrate 110 in which various device regions are formed. At this stage, the substrate no may include isolation regions such as shallow trench isolation (STI) regions as well as other regions formed therein.

The substrate 110 comprises a semiconductor substrate in various embodiments. In one or more embodiments, the substrate 110 may be a silicon wafer, or a silicon-on-insulator (SOI) wafer. In certain embodiments, the substrate 110 may comprise a germanium wafer, silicon germanium wafer, silicon carbide wafer, gallium arsenide wafer, gallium nitride wafer and other compound semiconductors. In other embodiments, the substrate 110 comprises heterogeneous layers such as silicon germanium on silicon, gallium nitride on silicon, silicon carbon on silicon, as well layers of silicon on a silicon or SOI substrate.

As further illustrated in FIG. 1A, the substrate 110 may comprise a plurality of nanosheet layers or nanosheets 130 formed therein. Specifically, the nanosheets 130 are embedded in a different material. The nanosheets 130 may be spaced apart from each other by one of a plurality of sacrificial layers or sacrificial layers 120. Thus, the substrate 110 comprises alternating layers of the sacrificial layers 120 and the nanosheets 130. It should be noted that while three layers of the nanosheets 130 are depicted in FIG. 1A, the number of layers is not limited. In various embodiments, the nanosheets 130, at the end of fabrication, may form the transistor channels, while the sacrificial layers 120 will be removed in a later step of fabrication to free up a void space for the formation of gate dielectric and gate terminal. In various embodiments, the nanosheets 130 have thickness of a few nanometer to tens of nanometer, for example, about 1 nm to about 20 nm in one embodiment. In another embodiment, the nanosheets 130 have thickness of about 1 nm to about 10 nm in one embodiment.

In certain embodiments, the sacrificial layers 120 comprise silicon germanium (SiGe) and the nanosheets 130 comprise silicon. In alternate embodiments, the sacrificial layers 120 comprise silicon and the nanosheets 130 comprise silicon germanium. For example, n-type field effect transistors and p-type field effect transistors may be formed with different types of materials in some embodiments. For example, n-FETs may be fabricated with using nanosheets 130 having high electron mobility while p-FETs may be fabricated with using nanosheets 130 having high hole mobility. In certain embodiments, the nanosheets 130 may be selected to be a material selected from Groups III-V of the periodic table and the sacrificial layer 120 may be selected to be a material from groups II-VI or group IV of the periodic table.

In some embodiments, a stack of the nanosheets 130 and the sacrificial layer 120 may be formed by deposition processes, for example, epitaxially by a chemical vapor deposition (CVD) method. In various embodiments, each layer of the sacrificial layers 120 and the nanosheets 130 may be few to several nanometers in thickness. In one embodiment, each layer of the sacrificial layers 120 may have a thickness between 5 nm and 20 nm and each layer of the nanosheets 130 may have a thickness between 1 nm and 10 nm.

As further illustrated in FIG. 1A, the substrate 110 may comprise a dielectric blocking layer 140 over the alternating layer stack of the nanosheets 130 and the sacrificial layer 120. The dielectric blocking layer 140 may be an oxide layer in one embodiment. The dielectric blocking layer 140 may be formed by deposition processes, for example, by a CVD method. The dielectric blocking layer 140 may be used as an etch stop layer and may be optional.

The substrate 110 may further comprise a dummy stack comprising a dummy material over the stack of the nanosheets 130 and the sacrificial layer 120. The dummy stack is patterned to form a dummy gate 150. In FIG. 1A, a feature of two fins for dummy gate 150 is illustrated as example. The dummy gate 150 may comprise polysilicon or amorphous silicon as example. The dummy gate 150 may be deposited using deposition techniques such as vapor deposition including chemical vapor deposition (CVD), physical vapor deposition (PVD), as well as other plasma processes such as plasma enhanced CVD (PECVD), sputtering, and other processes. The dummy gate 150 may have a thickness of about 50 nm to about 500 nm in various embodiments.

Still referring to FIG. 1A, a hard mask layer may be formed before the patterning to form a hard mask 160. The hard mask 160 may comprise silicon oxide in one embodiment. In various embodiments, the hard mask 160 may comprise silicon nitride, silicon carbonitride (SiCN), or silicon oxycarbide (SiOC). In alternate embodiments, the hard mask 160 may comprise titanium nitride. Further, the hard mask 160 may be a stacked hard mask comprising, for example, two or more layers using two different materials. The first hard mask of the hard mask 160 may comprise a metal-based layer such as titanium nitride, titanium, tantalum nitride, tantalum, tungsten based compounds, ruthenium based compounds, or aluminum based compounds, and the second hard mask material of the hard mask 160 may comprise a dielectric layer such as $SiO_2$, silicon nitride, SiCN, SiOC, silicon oxynitride, silicon carbide, amorphous silicon, or polycrystalline silicon. The hard mask 160 may be deposited using deposition techniques such as vapor deposition including chemical vapor deposition (CVD), physical vapor deposition (PVD), as well as other plasma processes such as plasma enhanced CVD (PECVD), sputtering, and other processes. The hard mask 160 may have a thickness of about 5 nm to about 50 nm in various embodiments.

After patterning to form the dummy gate 150 and the hard mask 160, a first sidewall spacer layer 170 is deposited over the alternating layer stack of the nanosheets 130 and the sacrificial layer 120. In various embodiments, the optional dielectric blocking layer 140 may be etched prior to depositing the first sidewall spacer layer 170. In various embodiments, the first sidewall spacer layer 170 may comprise a dielectric material comprising an oxide or a nitride. In certain embodiments, the first sidewall spacer layer 170 may comprise silicon-containing dielectric materials such as silicon oxide, silicon oxynitride (SiON), silicon oxycarbonitride (SiOCN) and silicon boron carbonitride (SiBCN). The first sidewall spacer layer 170 may be deposited using deposition techniques such as vapor deposition including chemical vapor deposition (CVD), physical vapor deposition (PVD), as well as other plasma processes such as plasma enhanced CVD (PECVD), atomic layer deposition (ALD), sputtering, and other processes. The first sidewall spacer layer 170 may have a thickness of about 1 nm to about 10 nm in various embodiments. In certain embodiments, the first sidewall spacer layer 170 may be a stacked layer comprising, for example, two or more layers using two different materials.

As further illustrated in FIG. 1A, a metal-containing liner 180 may be formed over the first sidewall spacer layer 170 as a protective layer for the first sidewall spacer layer 170. In various embodiments, the metal-containing liner 180 comprises a layer of pure metal, a metal oxide, a metal nitride, a metal oxynitride, a metal silicate, or a metal silicon oxynitride. Examples of the metal oxide useful in various embodiments include hafnium oxide, titanium oxide, tantalum oxide, and aluminum oxide. Examples of the metal nitride include aluminum nitride, tantalum nitride, and titanium nitride. In different embodiments, the metal-containing liner may comprise hafnium zirconium mixed oxide or hafnium silicate.

In an alternative method, silicon oxide (e.g., $SiO_2$) may be used as a liner material. However, $SiO_2$ has a low etch resistivity during subsequent processes including the inner spacer etch back and dilute hydrogen fluoride (DHF) wet cleaning step after the source/drain fin etch back. Accordingly, to provide sufficient protection for the first sidewall spacer layer, the $SiO_2$ liner may have to be relatively thick, for example, at 3-5 nm. With significantly narrow trenches in a nanosheet transistor, it is desirable to minimize the thickness of a liner. A metal-containing liner may have better etch resistivity compared to $SiO_2$, and thereby enabling a thinner liner to achieve the same level of protection for the first sidewall spacer layer 170.

In certain embodiments, the metal-containing liner 180 has a thickness of 2 nm or less, e.g., between 0.5 nm and 2 nm. In certain embodiments, the metal-containing liner 180 may be a stacked layer comprising, for example, two or more layers using two different materials. The formation of the metal-containing liner 180 may be performed by deposition from a gas phase, for example, using chemical vapor deposition (CVD), plasma-enhanced CVD (PECVD), low-pressure CVD (LPCVD) physical vapor deposition (PVD), atomic layer deposition (ALD), and/or other deposition processes. For a plasma deposition process, a precursor gas mixture can be used including but not limited to silanes, hydrocarbons, fluorocarbons, metal-containing compounds, or nitrogen containing compounds in combination with one or more dilution gases (e.g., argon, nitrogen, etc.) at a variety of pressure, power, flow and temperature conditions.

In certain embodiments, the deposition of the metal-containing liner 180 is performed by a ALD process comprising two sequential steps: (1) exposing the substrate to a first gas comprising a metal precursor that chemically adsorbs on the surface and (2) exposing the substrate to a second gas to covert the metal precursor adsorbed on the substrate to a layer of the metal-containing liner. These steps of ALD may be repeated to achieve a target deposition thickness. In a ALD process in accordance with certain embodiments, the second gas may comprises oxygen, nitrogen, or the combination thereof, and the metal precursor is converted to a metal-containing liner comprising oxygen, nitrogen, or the combination thereof. In certain embodiments, the metal-containing liner may be composed of a mixture of multiple material compositions, for example, a doped material or multilayered material, which may be deposited by an ALD process using more than one metal precursor and combining multiple binary ALD processes into a single sequence, so-called supercycle (ternary ALD).

In some embodiments, the metal-containing liner is hafnium oxide, and the formation of the hafnium oxide liner is performed by an ALD process using hafnium tetrakis(ethylmethylamide), hafnium nitrate, or hafnium tetrachloride as the metal precursor. The second gas comprises ozone ($O_3$) or $H_2O$ as an oxygen source. Alternatively, oxygen plasma (02 plasma) may be used. The substrate temperature may be kept between 150° C. and 325° C. The pressure in a processing chamber is maintained at about 10 mbar. An ALD process may advantageously offer a precise thickness control for the deposition of the metal-containing liner.

In all Figures in the disclosure, the aspect ratios of features are not to scale and for illustration purposes only. In certain embodiments, a fin height may be between 200 nm and 250 nm and the distance between the two fins may be between 6 nm and 12 nm. This high aspect ratio makes it challenging to etch target materials sufficiently from the trench while preventing any damage to other materials.

FIG. 1B illustrates the substrate 110 after anisotropically etching the metal-containing liner 180, the first sidewall spacer layer 170, and the alternating layer stack of nanosheets 130 and sacrificial layer 120 to form spacers and a plurality of vertical recesses 125.

The anisotropic etching removes the lateral portions of the metal-containing liner 180 and the first sidewall spacer layer 170, leaving the vertical portions on the sidewalls of the dummy gate 150 and the hard mask 160. Due to the thickness of the first sidewall spacer layer 170, the bottom end of metal-containing liner 180 may not be in contact with the dielectric blocking layer 140 or the alternating layer stack of the nanosheets 130 and the sacrificial layer 120.

In the following, a source/drain fin etch back process may be performed to anisotropically remove the dielectric blocking layer 140 and the alternating layer stack of the nanosheets 130 and the sacrificial layer 120, forming fin features (primarily the channel regions of the transistors) under the dummy gate structures separated by the plurality of vertical recesses 125. In various embodiments, these etch back processes may be performed as a single etch process or alternately as two or more etch processes. In certain embodiments, these etch back process may comprise one or more wet etch processes, plasma etch processes such as reactive ion etch (RIE) processes, or combinations of these or other etch processes.

In certain embodiments, a wet or dry etch cleaning process may be performed after the etch back process in FIG. 1B. In one embodiment, a dilute hydrogen fluoride (DHF) aqueous solution may be used in the cleaning process. Similar wet or dry cleaning processes may be performed at various stages of fabrication. While a $SiO_2$ liner may be damaged during the cleaning process due to its low etch resistivity to DHF, materials with better etch resistivity may be selected for a metal-containing liner 180 in accordance with various embodiments.

Figures 1C, 1D:
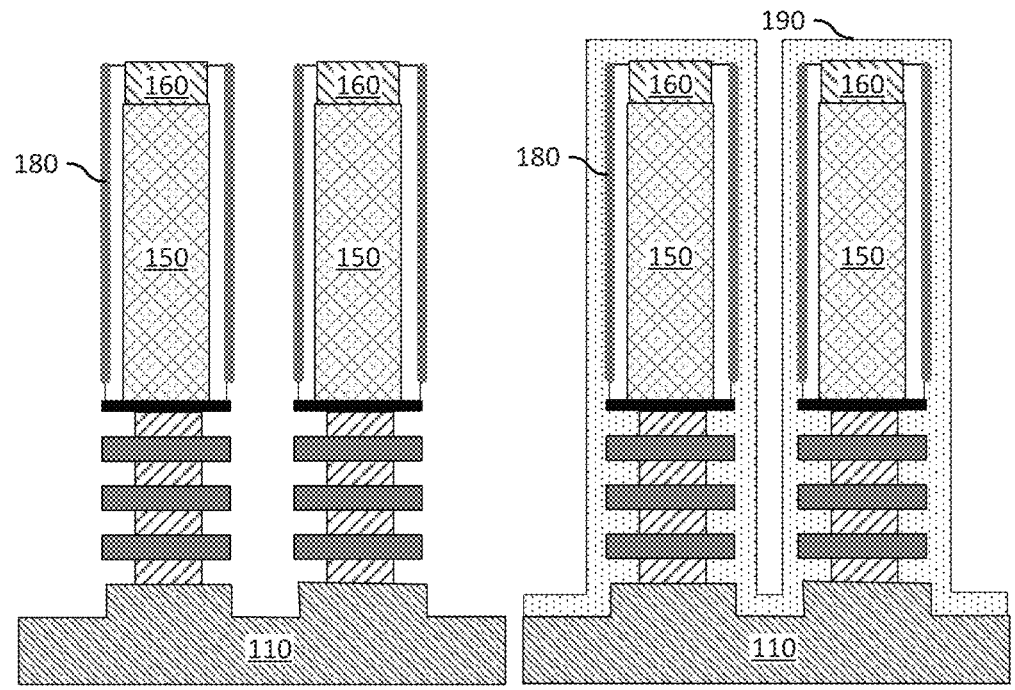

In FIG. 1C, a lateral recess etch (cavity etch) is performed to selectively remove a portion of the sacrificial layers 120 relative to the nanosheets 130 and generate a lateral recess feature between layers of the nanosheets 130. In certain embodiments, the lateral recess etch process comprises one or more isotropic etching process, for example, one or more wet etch processes. In alternate embodiments, the lateral recess etch process may include plasma etch processes such as atomic layer etching processes as well as reactive ion etch (RIE) processes or combinations of these or other etch processes.

In FIG. 1D, a second sidewall spacer layer 190 is deposited over the substrate 110. In this step, the lateral recess generated in the previous step as illustrated in FIG. 1C is also filled with the second sidewall spacer layer material. In certain embodiments, the second sidewall spacer layer 190 may comprise silicon-containing dielectric materials such as silicon nitride, silicon carbonitride (SiCN), silicon oxycarbonitride (SiOCN) and silicon boron carbonitide (SiBCN). The formation of the second sidewall spacer layer 190 may be performed by deposition from a gas phase, for example, using chemical vapor deposition (CVD), plasma-enhanced CVD (PECVD), low-pressure CVD (LPCVD) physical vapor deposition (PVD), atomic layer deposition (ALD), and/or other deposition processes. For a plasma deposition process, a precursor gas mixture can be used including but not limited to silanes, hydrocarbons, fluorocarbons, or nitrogen containing compounds in combination with one or more dilution gases (e.g., argon, nitrogen, etc.) at a variety of pressure, power, flow and temperature conditions.

Figures 1E, 1F:
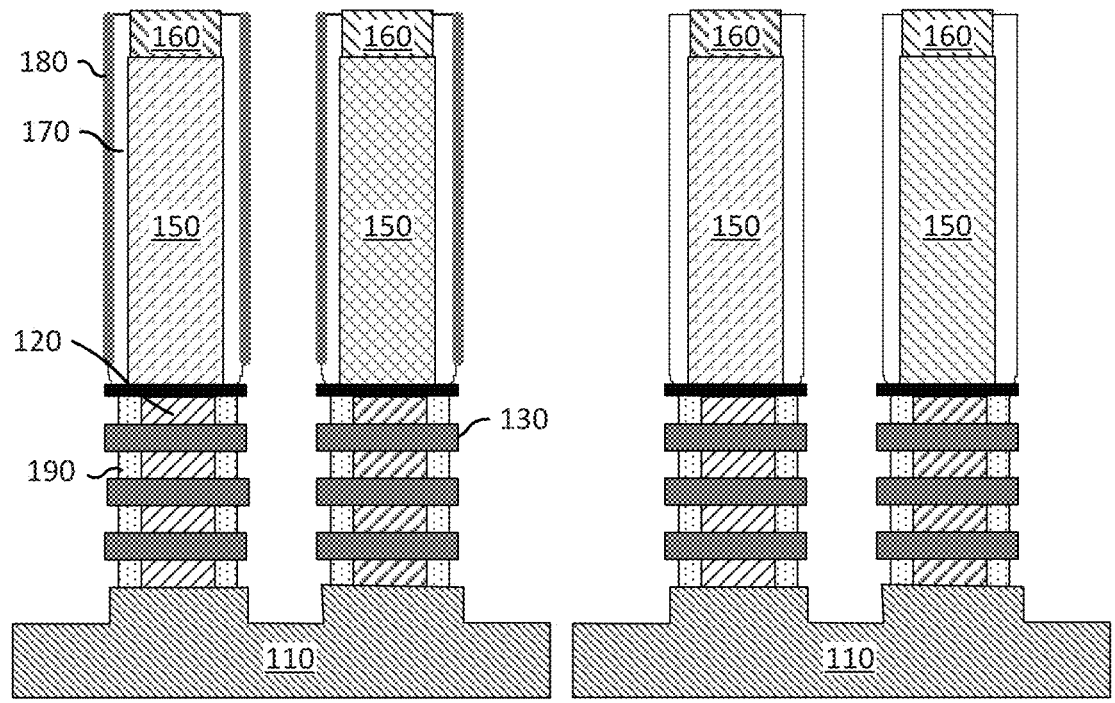

In FIG. 1E, a second sidewall spacer etch back is performed to remove a portion of the second sidewall spacer layer 190 and expose tips of the nanosheets 130. Some portions of the second sidewall spacer layer 190 are left between the layers of nanosheets 130. This remaining portions ensures the electrical insulation between the gate region and source/drain region that will be formed at later steps in fabrication. Thanks to the presence of the metal-containing liner 180, the first sidewall spacer layer 170 is protected from undesired etching, maintaining the conformal structure. With an appropriate selection of the metal-containing liner material, the first and second sidewall spacer layers 170 and 190 may have the same chemical composition, for example silicon oxycarbonitride (SiOCN), enabled by various embodiments of this invention. In some embodiments, the second sidewall spacer etch back may also remove a small portion of the first sidewall spacer layer 170 that was not protected by the metal-containing liner 180 at the bottom. This loss of the first sidewall spacer layer 170, however, may not be significant because of the minimal size of this portion at a scale of a few nm, the anisotropic characteristic of second sidewall spacer etch back, and the high aspect ratio. In various embodiments, the second sidewall spacer etch back process comprises one or more wet etch processes, plasma etch processes, reactive ion etch (RIE) processes, or combinations of these or other etch processes. In one or more embodiments, the second sidewall spacer etch back process comprises an anistropic etching process, for example, a RIE processes followed optionally by a short isotropic etching process to expose the layers of nanosheets 130.

Next, the metal-containing liner 180 may be removed prior to any further fabrication or after some subsequent fabrication steps such as source/drain formation. FIG. 1F illustrates an embodiment in which another etch is performed by an isotropic etch to remove the metal-containing liner 180 prior to further fabrication processes. In certain embodiments, the etch process comprises one or more wet etch processes, plasma etch processes or combinations of these or other etch processes.

In alternate embodiments, the metal-containing liner removal may be performed by an atomic layer etching (ALE) process comprising two sequential steps: (1) exposing the substrate to a first gas comprising a hydrogen fluoride (HF) to induce fluorination and (2) exposing the substrate to a second gas comprising a ligand-exchange reagent to covert the metal-containing layer to a more volatile product. These steps may be repeated to achieve a desired level of etching.

Gas compositions may be selected to achieve an effective etching rate for the metal-containing liner and a selectivity against other materials. An ALE process may advantageously provide etch selectivity of the metal-containing linger against the other materials used as various components in the device. Furthermore, the ALE process proceeds in a stepwise manner thereby enabling a precise thickness control.

In some embodiments, the metal-containing liner 180 is hafnium oxide and the removal of the hafnium oxide liner may be performed by an ALE process, wherein hydrogen fluoride (HF) and dimethylaluminium chloride (DMAC) are used in the first and second gases, respectively. The substrate temperature may be kept between 250° C. and 355° C.

In alternate embodiments, the metal-containing liner 180 comprises a metal nitride, and the removal of the metal-containing liner 180 may be performed by a ALE process, wherein, in addition to hydrogen fluoride (HF) and a ligand-exchange reagent, a gas comprising oxygen such as ozone ($O_3$) is used in the first gas or as a separate pretreatment step to convert at least a portion of the nitride to an oxide first before etching.

Figures 1G, 1H:
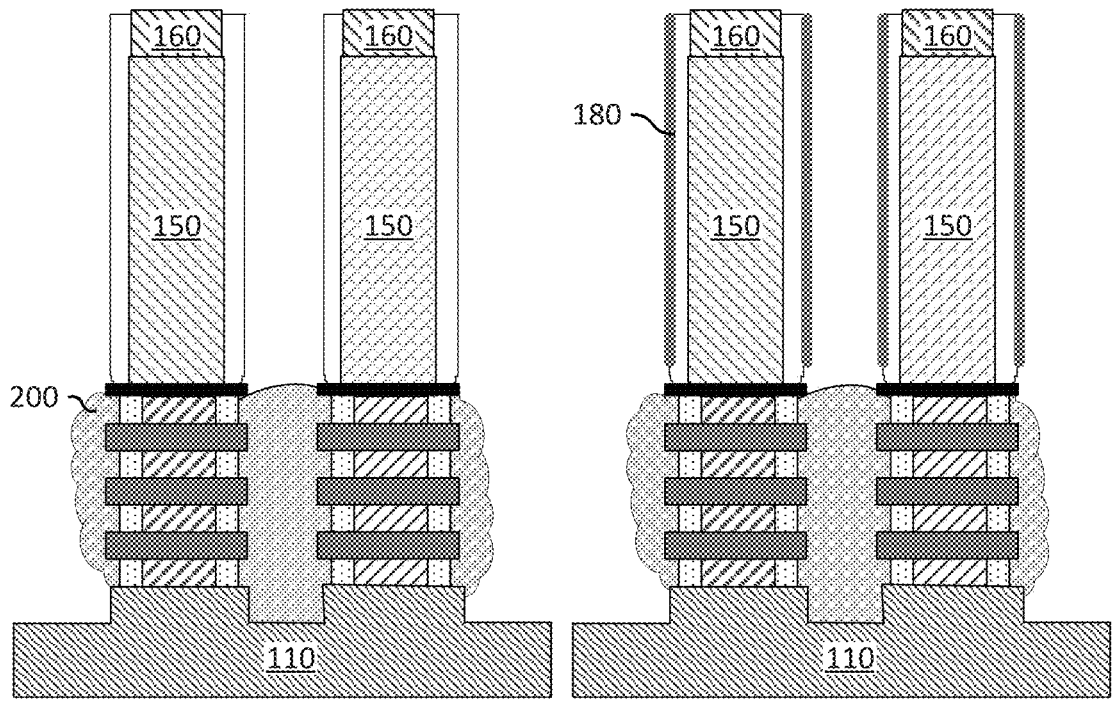

As illustrated in FIG. 1G, after the removal of the metal-containing liner 180, a source/drain region 200 may be formed within the source/drain fin feature. The source/drain region 200 fills the lateral recess and a portion of the fin feature over the exposed tips of the nanosheets 130. The formation of the source/drain region 200 may be performed, for example, by epitaxial growth. Although not shown, a source/drain region 200 formed with an epitaxial growth process typically has a faceted outer surface. In various embodiments, the source/drain material comprises silicon-germanium. In alternate embodiments, as illustrated in FIG. 1H, the source/drain region 200 may be formed prior to the removal of the metal-containing liner 180. The removal of the metal-containing liner 180 may be performed next after the source/drain formation, resulting in the same feature as illustrated in FIG. 1G.

Figure 1I:
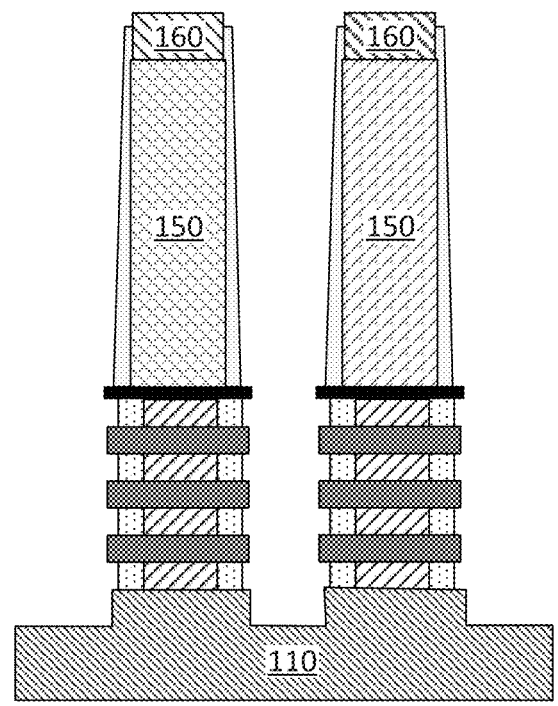

The embodiment methods, using the metal-containing liner 180, enable an effective protection of the first sidewall spacer layer 170 during fabrication. As illustrated in FIG. 1I, if the metal-containing liner is absent in fabrication, the process flow described above may lead to a severe loss of the first sidewall spacer layer 170 during the second sidewall spacer etch back process, and the conformal feature of the first sidewall spacer layer 170 may be lost. Such damage may be critically detrimental to device performance and process yield.

As a semiconductor device, various other device regions may be formed in the substrate 110 illustrated in FIGS. 1A-1I. As one example, FIG. 1J illustrates an extended cross-sectional view of FIG. 1F, and FIG. 1K illustrates another cross-sectional view perpendicular to FIG. 1J.

FIG. 1J is similar to FIG. 1F as described above. FIG. 1K is the other cross-sectional view along with a cross section indicated by a dotted line 1k in FIG. 1J. Conversely, FIG. 1J illustrates the cross sectional view along with a cross section 1j in FIG. 1K. In FIG. 1K, isolation regions such as shallow trench isolation (STI) regions 195 are visible, which may also be present in all of the previous embodiment illustrations (FIGS. 1A-1J). The STI regions 195 serve to electrically isolate adjacent electronic components. With a completion of sidewall spacer formation (e.g., FIG. 1D) and second sidewall spacer etch back (e.g., FIG. 1E), the tips of the nanosheets 130, the dielectric blocking layer 140, and the second sidewall spacer 190 are exposed and visible in the source/drain regions, but not the sacrificial layers 120, which are masked by the second sidewall spacer 190. Further, in FIG. 1K, the dummy gate 150 visible in FIG. 1J is masked by the first sidewall spacer 170. The first sidewall spacer 170 is visible after a completion of removing the metal-containing liner removal 180 (e.g., FIG. 1F).

In FIGS. 2A-2D, an example process of fabrication in accordance with alternate embodiments is illustrated, wherein the first sidewall spacer is etched back prior to depositing the metal-containing liner 180 so that the metal-containing liner 180 entirely covers the sidewall of the first sidewall spacer layer 170.

Figure 2A:
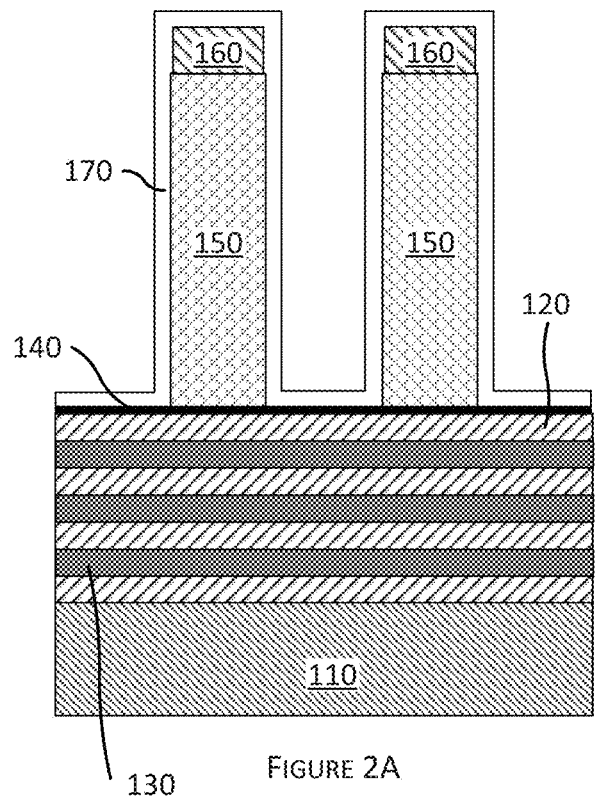

FIG. 2A illustrates the substrate 110 having the same feature as illustrated in FIG. 1A, except the subsequent formation of the metal-containing liner 180 is different. FIG. 2A illustrates the substrate 110 after the formation of the first sidewall spacer layer 170 but prior to the formation of the metal-containing liner 180.

Figure 2B:
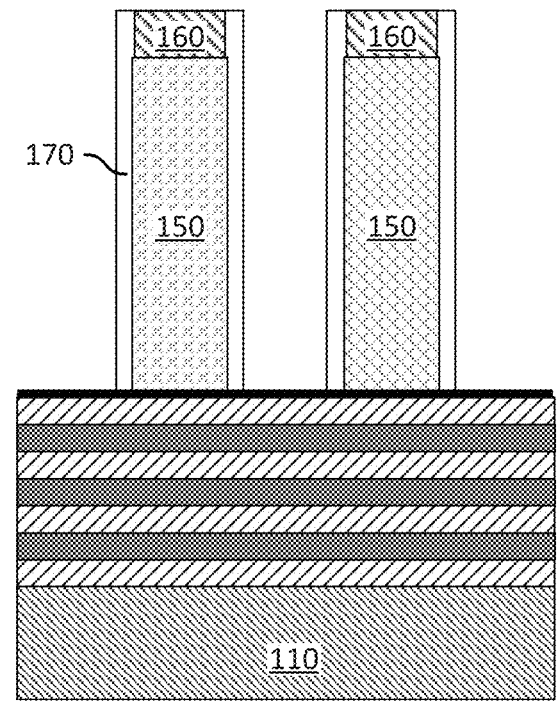
Figure 2C:
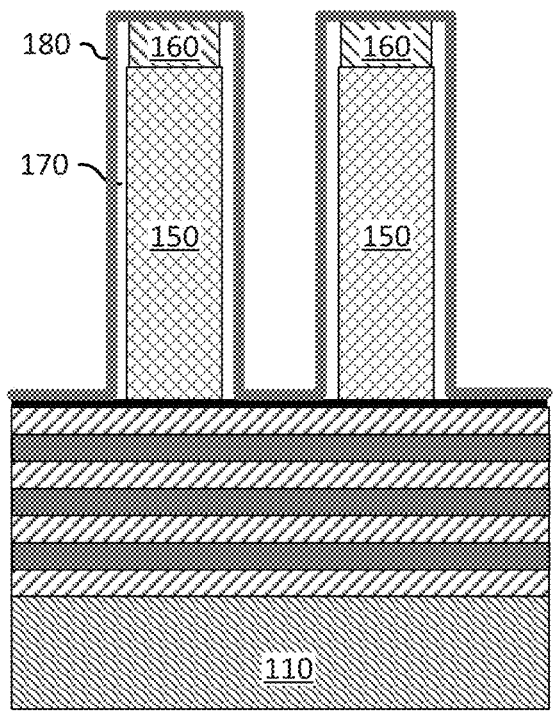

In FIG. 2B, as an additional step, an anisotropic etch is performed to remove the lateral section of the first sidewall spacer layer 170. The anisotropic etch of the first sidewall spacer layer 170 may be performed by one or more wet etch processes, plasma etch processes such as reactive ion etch (RIE) processes, or combinations of these or other etch processes. FIG. 2C illustrates the structure after forming the metal-containing liner 180.

Unlike the prior embodiments, the metal-containing liner 180 now fully covers the underlying first sidewall spacer layer 170. The metal-containing liner 180 may be deposited over the optional dielectric blocking layer 140 or over the sacrificial layers 120 after anistropically etching the optional dielectric blocking layer 140. In the following, as illustrated in FIG. 2C, the metal-containing liner 180 may be deposited in the same way as described above referring to FIG. 1A, by deposition from a gas phase, for example, using chemical vapor deposition (CVD), plasma-enhanced CVD (PECVD), low-pressure CVD (LPCVD) physical vapor deposition (PVD), atomic layer deposition (ALD), and/or other deposition processes.

Figure 2D:
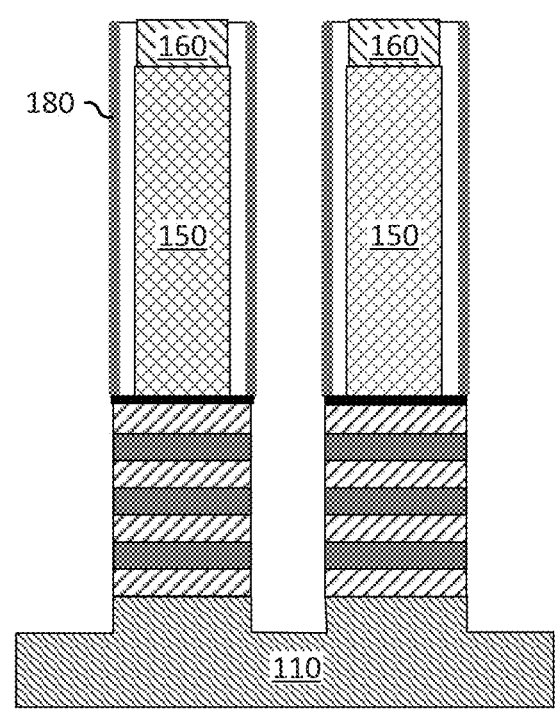

In FIG. 2D, a liner etch back and a source/drain fin etch back may be performed, which is in correspondence with FIG. 1B in the previously described embodiments. A liner etch back is performed to anisotropically remove the lateral portions of the metal-containing liner 180, leaving the vertical portions on the sidewalls of the first sidewall spacer layer 170. In the following, the source/drain fin etch back is performed to anisotropically remove the dielectric blocking layer 140 and the alternating layer stack of the nanosheets 130 and the sacrificial layer 120, forming a fin feature for source/drain structures between the dummy gate structures. In various embodiments, these etch backs may be performed as a single etch process or alternately as two or more etch processes. In certain embodiments, the etch back process comprises one or more wet etch processes, plasma etch processes such as reactive ion etch (RIE) processes, or combinations of these or other etch processes. After the source/drain fin feature is formed, the subsequent fabrication steps such as a lateral recess etch, a second sidewall spacer formation, a second sidewall spacer etch back, a metal-containing liner removal, and a source/drain formation may be performed in the same way as previously described referring to FIGS. 1C-1G.

In various embodiments, a metal-containing liner 180 formation (FIGS. 1A and 2A) is performed prior to a source/drain fin etch back (FIGS. 1B and 2D) and lateral recess etch (FIG. 1C), thereby the nanosheets 130 and lateral recess region are advantageously free from the metal-containing liner. This sequence of steps in fabrication advantageously ensures improving process margin and therefore process yield and device performance. If a liner formation is performed after a source/drain fin etch back and lateral recess etch, the liner will be deposited within the lateral recess region and in contact with the sacrificial layers 120. Further, after the deposition of the second sidewall spacer layer 190, the liner will be covered with the second sidewall spacer layer 190. This region of the liner buried under the second sidewall spacer layer 190 cannot be removed without damaging the second sidewall spacer layer 190, and therefore this region of the liner may be present in the final device. The presence of an metal-containing liner can significantly deteriorate the performance of the final device due to increased parasitic capacitances as well as may be cause yield issues.

Figure 3A:
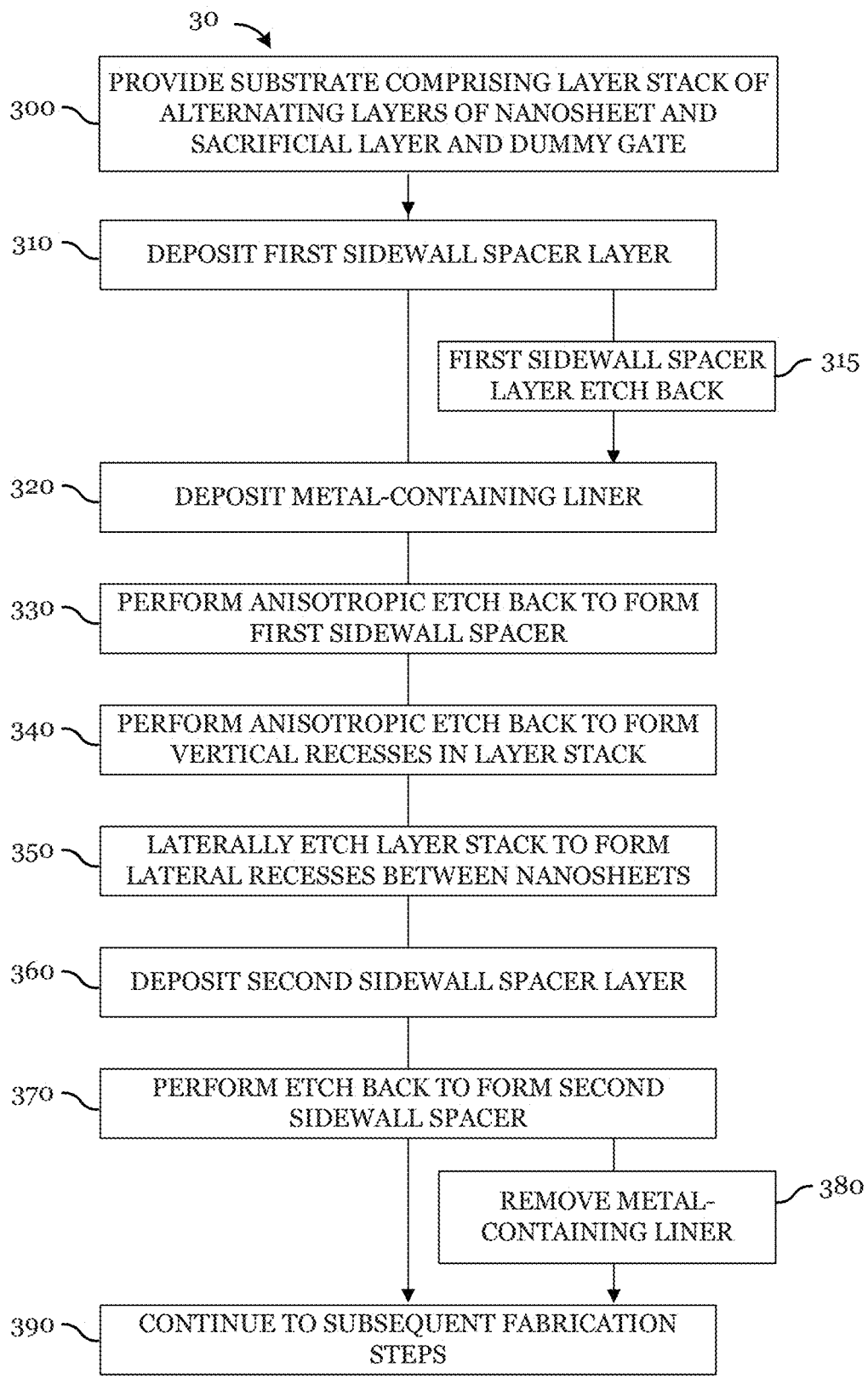
Figure 4:
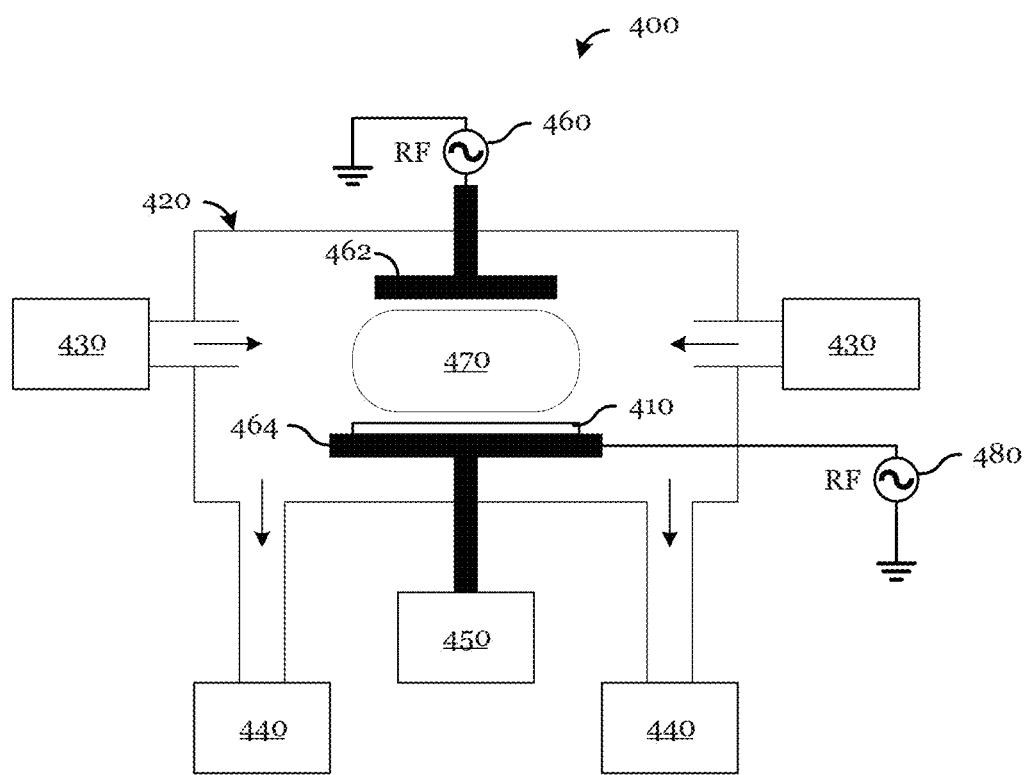
FIG. 4 illustrates a processing tool in accordance with an embodiment of this disclosure.

In FIG. 3A, an embodiment process flow of nanosheet transistor fabrication is illustrated. The process flow can be followed with the figures discussed above and hence will not be described again.

A process flow 30 starts with providing a substrate comprising a dummy gate stack and a hard mask over an alternating layer stack of nanosheets and sacrificial layers in a processing chamber (block 300). First, a first sidewall spacer layer is deposited over the substrate (block 310) (e.g., FIG. 1A). Next, an optional first sidewall spacer layer etch back may be performed (block 315) (e.g., FIG. 2B). A metal-containing liner is then deposited over the substrate (block 320) (e.g., FIGS. 1A and 2C).

In the following, a first sidewall spacer layer and liner etch back, or a liner etch back, is performed (block 330) to remove the lateral section of the first sidewall spacer layer and the metal-containing liner. A source/drain fin etch back is then performed (block 340) (e.g., FIGS. 1B and 2D) to form a plurality of vertical recesses in the layer stack. During this step, any residual materials of the first sidewall spacer layer and metal-containing liner on the lateral surface may be removed as well. Next, a lateral recess etch is performed (block 350) (e.g., FIG. 1C) to selectively remove a portion of the sacrificial layer relative to the nanosheets and generate lateral recesses between the adjacent nanosheets. Subsequently, a second sidewall spacer layer is deposited (block 360) (e.g., FIG. 1D). A second sidewall spacer layer etch back (block 370) (e.g., FIG. 1E) is then performed to remove a portion of the deposited second sidewall spacer layer, wherein the tips of nanosheets will be exposed, while preserving a portion of the deposited second sidewall spacer layer inside the lateral recesses. Lastly, the metal-containing liner may be removed by an isotropic etch process (block 380) (e.g., FIG. 1F) prior to further fabrication steps (block 390) (e.g., FIG. 1G). In certain embodiments, this removal step may be performed at a later stage (e.g., FIG. 1H). Such an option is enabled by the embodiment methods but may not be available with conventional methods for liner deposition. Further fabrication steps of nanosheet transistor after the second sidewall spacer etch back (block 370) or the liner removal (block 380) may comprise dual source/drain epitaxy formation, channel release, replacement metal gate (RMG), and middle-of-line (MOL)/back-end-of-line (BEOL) processes.

Figure 3B:
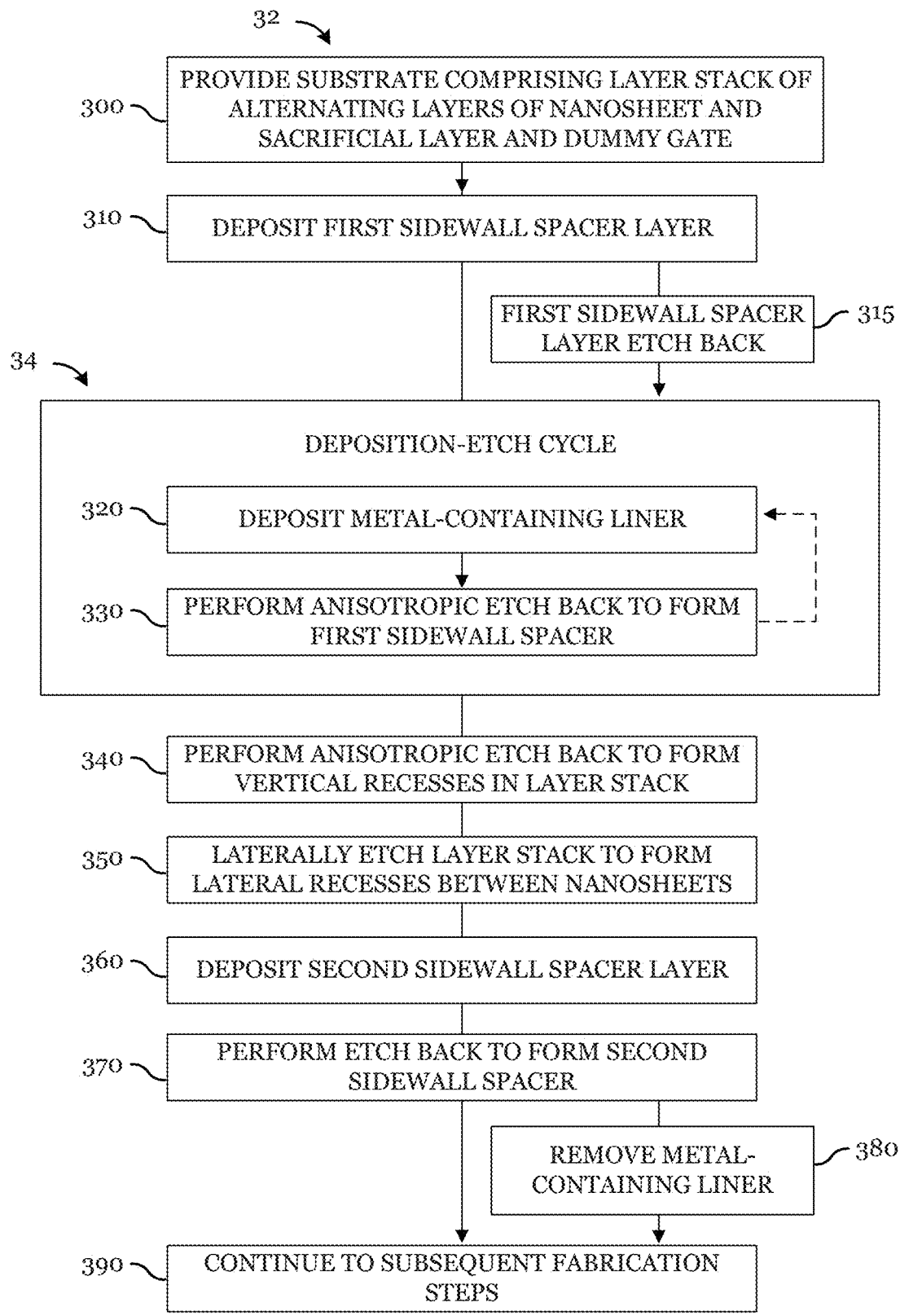

In FIG. 3B, an alternate embodiment process flow 32 is illustrated. In the embodiment method, one or more cycles of the deposition-etch processes (blocks 320 and 330) (e.g., FIGS. 1A and 2C) for the metal-containing liner may be repeated (block 34) prior to the subsequent source/drain fin etch back (block 340) step (e.g., FIGS. 1B and 2D). Because an etch process may offer better anisotropy than a conformal deposition, the repeated cycles of deposition-etch processes for the metal-containing liner may improve the anisotropy of the process and thus help selectively forming the metal-containing liner on the side walls of the dummy gate structure relative to on the lateral surface. The rest of the process flow after the cycles of the deposition-etch processes (block 34) may be unchanged. In various embodiments, process parameters for the deposition (bock 320) and the etch (block 330) may be varied for each cycle to obtain the desired process performance. The process parameters for deposition and desorption may comprise gas composition, gas flow rate, source power, bias power, plasma density, pressure, temperature, and processing time.

Figure 3C:
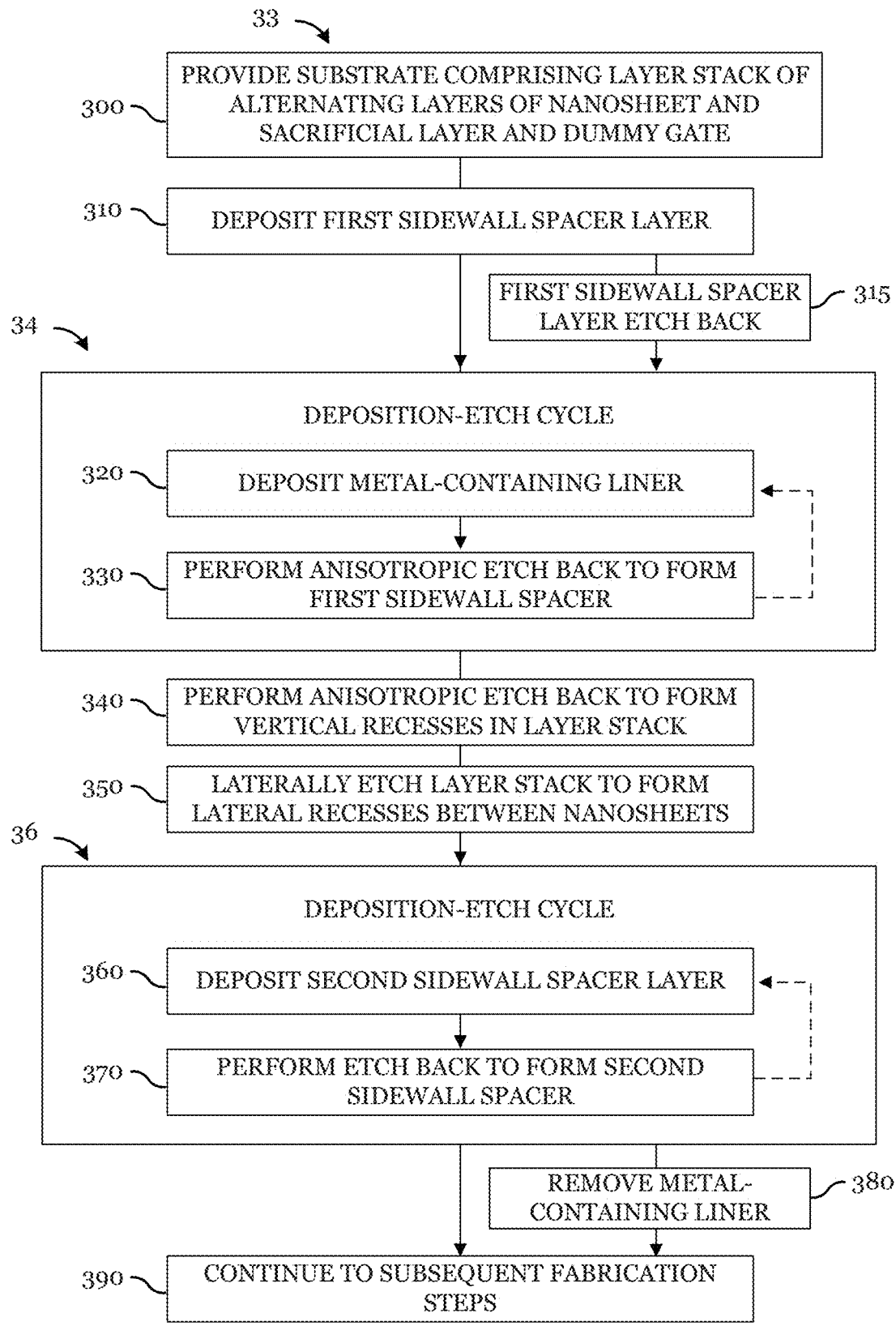

In FIG. 3C, another alternate embodiment process flow 33 is illustrated. In addition to the deposition-etch cycle 34, illustrated in FIGS. 4B and 4C, a second deposition-etch cycle 36 may be performed by repeating the deposition and etch back for the second sidewall spacer (blocks 360 and 370) (e.g., FIGS. 1D and 1E). Similarly to the deposition-etch cycle 34 for the metal-containing liner, performing the deposition-etch cycle 36 for the second sidewall spacer may improve the anisotropy of the process and thereby be beneficial for effective filling of the second sidewall spacer in the lateral recess. In various embodiments, process parameters for the deposition (block 360) and the etch (block 370) may be varied for each cycle to obtain the desired process performance. The process parameters for deposition and desorption may comprise gas composition, gas flow rate, source power, bias power, plasma density, pressure, temperature, and processing time.

In various embodiments of the disclosure, the process of nanosheet transistor fabrication may be performed in a plasma processing chamber. An example processing tool for the embodiment methods is illustrated in FIG. 4.

In FIG. 4, a plasma processing system 400 comprises a plasma processing chamber 420 connected to a gas delivery system 430 and a vacuum pump system 440. Gases may be introduced into the plasma processing chamber 420 through the gas delivery system 430. A substrate 410 may be mounted on a substrate holder 464 inside the plasma processing chamber 420. The substrate holder 464 may be a circular electrostatic chuck. The substrate 410 may be maintained at a desired process temperature using a temperature controller. Further, the substrate holder 464 is connected to a first RF power source 480 and may be a bottom electrode, while a top electrode 462 is connected to a second RF power source 460 to power a plasma 470 inside the plasma processing chamber 420. In various embodiments, the top electrode 562 may be a conductive coil located, over a top ceramic window, outside the plasma processing chamber 420.

The configuration of the plasma processing system 400 described above is by example only. In alternative embodiments, various alternative configurations may be used for the plasma processing system 400. For example, inductively coupled plasma (ICP) may be used with RF source power coupled to a planar coil over a top dielectric cover, or capacitively coupled plasma (CCP) generated using a disc-shaped top electrode in the plasma processing chamber 420, the gas inlet and/or the gas outlet may be coupled to the sidewall, etc. Pulsed RF power sources and pulsed DC power sources may also be used in some embodiments (as opposed to continuous wave RF power sources). In various embodiments, the RF power, chamber pressure, substrate temperature, gas flow rates and other plasma process parameters may be selected in accordance with the respective process recipe. In some embodiments, the plasma processing system 400 may be a resonator such as a helical resonator.

In addition, embodiments of the present invention may be also applied to remote plasma systems as well as batch systems. For example, the substrate holder may be able to support a plurality of wafers that are spun around a central axis as they pass through different plasma zones.

Example embodiments of the invention are summarized here. Other embodiments can also be understood from the entirety of the specification as well as the claims filed herein.

Example 1. A method of processing a substrate, the method including: depositing a first sidewall spacer layer over the substrate, the substrate including a layer stack including alternating layers of a nanosheet and a sacrificial layer, and a dummy gate formed over the layer stack, the first sidewall spacer layer formed over the dummy gate; depositing a metal-containing liner over the first sidewall spacer layer; forming a first sidewall spacer along the dummy gate by anisotropically etching the metal-containing liner and the first sidewall spacer layer; after forming the first sidewall spacer, performing an anisotropic etch back process to form a plurality of vertical recesses in the layer stack; laterally etching the layer stack to selectively remove a part of the sacrificial layers and form a plurality of lateral recesses between adjacent nanosheets; depositing a second sidewall spacer layer to fill the plurality of lateral recesses; and etching a portion of the second sidewall spacer layer to expose tips of the nanosheet layers, the remaining portion of the second sidewall spacer layer forming a second sidewall spacer.

Example 2. The method of example 1, further including before depositing the metal-containing liner, anisotropically etching the first sidewall spacer layer to form a dummy gate spacer.

Example 3. The method of one of examples 1 or 2, further including after etching the portion of the second sidewall spacer layer, removing the metal-containing liner.

Example 4. The method of one of examples 1 to 3, further including epitaxially growing a semiconductor region from the exposed tips of the nanosheets.

Example 5. The method of one of examples 1 to 4, where removing the metal-containing liner is performed after epitaxially growing the semiconductor region from the exposed tips of the nanosheets.

Example 6. The method of one of examples 1 to 5, where the removal of the metal-containing liner is performed by performing an atomic layer etching (ALE) process.

Example 7. The method of one of examples 1 to 6, the atomic layer etching (ALE) process including a cyclic process, the cyclic process including: exposing the substrate to a first gas stream including hydrogen fluoride; and exposing the substrate to a second gas stream including a ligand-exchange reagent.

Example 8. The method of one of examples 1 to 7, where the nanosheet includes silicon and the sacrificial layer includes a silicon germanium, or the nanosheet includes a silicon germanium and the sacrificial layer includes silicon.

Example 9. The method of one of examples 1 to 8, where the first sidewall spacer include silicon oxide, silicon oxynitride (SiON), silicon oxycarbonitride (SiOCN) or silicon boron carbonitide (SiBCN), and the second sidewall spacer include silicon nitride, silicon carbonitride (SiCN), silicon oxycarbonitride (SiOCN), or silicon boron carbonitride (SiBCN).

Example 10. The method of one of examples 1 to 9, where the first and second sidewall spacers have the same composition.

Example 11. The method of one of examples 1 to 10, where the metal-containing liner includes a layer of pure metal, a metal oxide, a metal nitride, a metal oxynitride, a metal silicate, or a metal silicon oxynitride.

Example 12. The method of one of examples 1 to 11, where the metal-containing liner includes hafnium oxide, titanium oxide, tantalum oxide, or aluminum oxide.

Example 13. The method of one of examples 1 to 12, where the metal-containing liner includes aluminum nitride, tantalum nitride, or titanium nitride.

Example 14. The method of one of examples 1 to 13, where the deposition of the metal-containing liner is performed by an atomic layer deposition (ALD) process, the ALD process including: exposing the substrate to a first gas including a metal precursor, where the metal precursor is selected to be chemically adsorbed on the substrate; and exposing the substrate to a second gas, where the metal precursor adsorbed on the substrate is converted to form a layer of the metal-containing liner.

Example 15. The method of one of examples 1 to 14, where the second gas includes oxygen and the metal precursor is converted to the metal-containing liner including a metal oxide, or the second gas includes nitrogen and the metal precursor is converted to the metal and nitrogen containing liner.

Example 16. A method of processing a substrate, the method including: performing a plurality of deposition-etch steps to form a first sidewall spacer, the plurality of deposition-etch steps including: depositing a first sidewall spacer layer over the substrate, the substrate including a layer stack including alternating layers of a nanosheet and a sacrificial layer, and a dummy gate disposed over the layer stack; depositing a metal-containing liner over the first sidewall spacer layer; and anisotropically etching the metal-containing liner and the first sidewall spacer layer; performing an anisotropic source/drain fin etch back to form vertical recesses in the layer stack; isotropically etching the layer stack to selectively remove a part of the sacrificial layer and form indentations between adjacent ones of the nanosheets; depositing a second sidewall spacer layer to fill the indentations; and etching a portion of the second sidewall spacer layer to expose tips of the nanosheets, the remaining portion of the second sidewall spacer layer forming a second sidewall spacer.

Example 17. The method of example 16, further including: removing the metal-containing liner and growing epitaxial source/drain regions from the exposed tips of the nanosheets.

Example 18. The method of one of examples 16 or 17, where the metal-containing liner is removed before the growing.

Example 19. A method of processing a substrate, the method including: performing a first plurality of deposition-etch steps to form a first sidewall spacer, the first plurality of deposition-etch steps including: depositing a first sidewall spacer layer over the substrate, the substrate including a layer stack including alternating layers of a nanosheet layer and a sacrificial layer, and a dummy gate disposed over the layer stack; depositing a metal-containing liner over the first sidewall spacer layer; and anisotropically etching the metal-containing liner and the first sidewall spacer layer; performing an anisotropic source/drain fin etch back process to form vertical recesses; laterally etching to selectively remove a part of the sacrificial layer and form indentations between the nanosheets; performing a second plurality of deposition-etch steps to form a second sidewall spacer, the second plurality of deposition-etch steps including: depositing a second sidewall spacer layer to fill at least a portion of the indentations; and etching a portion of the second sidewall spacer layer to expose tips of the nanosheets.

Example 20. The method of example 19, further including: after performing the anisotropic source/drain fin etch back, performing a wet etch cleaning.

Example 21. The method of one of examples 19 or 20, where the wet etch cleaning is performed with a dilute hydrogen fluoride (DHF) aqueous solution.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:
    depositing a first sidewall spacer layer over the substrate, the substrate comprising a layer stack comprising alternating layers of a nanosheet and a sacrificial layer, and a dummy gate formed over the layer stack, the first sidewall spacer layer formed over the dummy gate;
    depositing a metal-containing liner over the first sidewall spacer layer;
    forming a first sidewall spacer along the dummy gate by anisotropically etching the metal-containing liner and the first sidewall spacer layer;
    after forming the first sidewall spacer, performing an anisotropic etch back process to form a plurality of vertical recesses in the layer stack;
    laterally etching the layer stack to selectively remove a part of the sacrificial layers and form a plurality of lateral recesses between adjacent nanosheets;
    depositing a second sidewall spacer layer to fill the plurality of lateral recesses;
    etching a portion of the second sidewall spacer layer to expose tips of the nanosheets, a remaining portion of the second sidewall spacer layer forming a second sidewall spacer;
    after etching the portion of the second sidewall spacer layer, removing the metal-containing liner; and
    after removing the metal-containing liner, epitaxially growing a semiconductor region from the exposed tips of the nanosheets.

2. The method of claim 1, wherein the removal of the metal-containing liner is performed by performing an atomic layer etching (ALE) process.

3. The method of claim 2, the atomic layer etching (ALE) process comprising a cyclic process, the cyclic process comprising:
    exposing the substrate to a first gas stream comprising hydrogen fluoride; and
    exposing the substrate to a second gas stream comprising a ligand-exchange reagent.

4. The method of claim 1, wherein the nanosheet comprises silicon and the sacrificial layer comprises a silicon germanium, or the nanosheet comprises a silicon germanium and the sacrificial layer comprises silicon.

5. The method of claim 1, wherein the first sidewall spacer comprise silicon oxide, silicon oxynitride (SiON), silicon oxycarbonitride (SiOCN) or silicon boron carbonitride (SiBCN), and the second sidewall spacer comprise silicon nitride, silicon carbonitride (SiCN), silicon oxycarbonitride (SiOCN), or silicon boron carbonitride (SiBCN).

6. The method of claim 1, wherein the first and second sidewall spacers have the same composition.

7. The method of claim 1, wherein the metal-containing liner comprises a layer of pure metal, a metal oxide, a metal nitride, a metal oxynitride, a metal silicate, or a metal silicon oxynitride.

8. The method of claim 7, wherein the metal-containing liner comprises hafnium oxide, titanium oxide, tantalum oxide, or aluminum oxide.

9. The method of claim 7, wherein the metal-containing liner comprises aluminum nitride, tantalum nitride, or titanium nitride.

10. The method of claim 1, wherein depositing the metal-containing liner is performed by an atomic layer deposition (ALD) process, the ALD process comprising:
    exposing the substrate to a first gas comprising a metal precursor, wherein the metal precursor is selected to be chemically adsorbed on the substrate; and
    exposing the substrate to a second gas, wherein the metal precursor adsorbed on the substrate is converted to form a layer of the metal-containing liner.

11. The method of claim 10, wherein the second gas comprises oxygen and the metal precursor is converted to the metal-containing liner comprising a metal oxide, or the second gas comprises nitrogen and the metal precursor is converted to the metal and nitrogen containing liner.

12. A method of processing a substrate, the method comprising:
    depositing a first sidewall spacer layer over the substrate, the substrate comprising a layer stack comprising alternating layers of a nanosheet and a sacrificial layer, and a dummy gate disposed over the layer stack;
    anisotropically etching the first sidewall spacer layer to remove a horizontal portion of the first sidewall spacer layer and to form a dummy gate spacer;
    depositing a metal-containing liner over the substrate, the metal-containing liner covering the dummy gate spacer;
    anisotropically etching the metal-containing liner to remove a horizontal portion of the metal-containing liner;
    performing an anisotropic source/drain fin etch back to form vertical recesses in the layer stack;
    isotropically etching the layer stack to selectively remove a part of the sacrificial layer and form indentations between adjacent ones of the nanosheets;
    depositing a second sidewall spacer layer to fill the indentations; and
    etching a portion of the second sidewall spacer layer to expose tips of the nanosheets, a remaining portion of the second sidewall spacer layer forming a second sidewall spacer.

13. The method of claim 12, further comprising:
    removing the metal-containing liner and growing epitaxial source/drain regions from the exposed tips of the nanosheets.

14. The method of claim 13, wherein the metal-containing liner is removed before the growing.

15. The method of claim 12, wherein the layer stack comprising a blocking layer on top of the alternating layers and below the dummy gate, wherein anisotropically etching the first sidewall spacer layer exposes a portion of the blocking layer, and wherein depositing the metal-containing liner makes the portion of the blocking layer physically in contact with the metal-containing liner.

16. A method of processing a substrate, the method comprising:

depositing a first sidewall spacer layer over the substrate, the substrate comprising a layer stack comprising alternating layers of a nanosheet and a sacrificial layer, and a dummy gate disposed over the layer stack;

depositing a metal-containing liner over the first sidewall spacer layer, the metal-containing liner having a thickness less than a thickness of the first sidewall spacer layer;

anisotropically etching the metal-containing liner and the first sidewall spacer layer;

performing an anisotropic source/drain fin etch back process to form vertical recesses;

after performing the anisotropic source/drain fin etch back, performing a wet etch cleaning;

laterally etching to selectively remove a part of the sacrificial layer and form indentations between the nanosheets;

depositing a second sidewall spacer layer to fill at least a portion of the indentations; and etching a portion of the second sidewall spacer layer to expose tips of the nanosheets.

17. The method of claim 16, further comprising, after etching the portion of the second sidewall spacer layer, removing the metal-containing liner.

18. The method of claim 16, wherein the first and second sidewall spacers have the same composition comprising silicon oxycarbonitride (SiOCN).

19. The method of claim 16, wherein the thickness of the first sidewall spacer layer is between 1 nm and 10 nm, and wherein the thickness of the metal-containing liner is between 0.5 nm and 2 nm.

* * * * *